United States Patent
Van Kaam

(10) Patent No.: US 7,475,312 B2
(45) Date of Patent: Jan. 6, 2009

(54) INTEGRATED CIRCUIT (IC) WITH ON-BOARD CHARACTERIZATION UNIT

(75) Inventor: Kees Marinus Maria Van Kaam, Eindhoven (NL)

(73) Assignee: NXP B.V., Eindhoven (NL)

( * ) Notice: Subject to any disclaimer, the term of this patent is extended or adjusted under 35 U.S.C. 154(b) by 402 days.

(21) Appl. No.: 10/563,415

(22) PCT Filed: Jul. 1, 2004

(86) PCT No.: PCT/IB2004/051089

§ 371 (c)(1),
(2), (4) Date: Jan. 3, 2006

(87) PCT Pub. No.: WO2005/006005

PCT Pub. Date: Jan. 20, 2005

(65) Prior Publication Data

US 2006/0155500 A1      Jul. 13, 2006

(30) Foreign Application Priority Data

Jul. 9, 2003   (EP)   .................................. 03102062

(51) Int. Cl.
*G01R 31/28* (2006.01)

(52) U.S. Cl. ..................................................... 714/733
(58) Field of Classification Search ................. 714/724, 714/733

See application file for complete search history.

(56) References Cited

U.S. PATENT DOCUMENTS

| | | | | |
|---|---|---|---|---|
| 5,982,189 | A * | 11/1999 | Motika et al. | 324/763 |
| 6,427,217 | B1 * | 7/2002 | Hartnett | 714/733 |
| 6,496,947 | B1 * | 12/2002 | Schwarz | 714/30 |
| 6,556,938 | B1 | 4/2003 | Rohrbaugh et al. | |
| 6,889,332 | B2 * | 5/2005 | Helms et al. | 713/322 |
| 6,948,080 | B2 * | 9/2005 | Farwell | 713/300 |
| 6,978,402 | B2 * | 12/2005 | Hirabayashi | 714/42 |
| 7,036,062 | B2 * | 4/2006 | Morris et al. | 714/733 |
| 7,137,048 | B2 * | 11/2006 | Zerbe et al. | 714/715 |
| 2001/0035766 | A1 | 11/2001 | Nakajima | |
| 2004/0103355 | A1 * | 5/2004 | Correale et al. | 714/733 |

* cited by examiner

*Primary Examiner*—James C Kerveros
(74) *Attorney, Agent, or Firm*—Peter Zawilski

(57) ABSTRACT

Consistent with example embodiments, there is a system and method for providing a built-in characterization of a semiconductor device. The device is provided with a built-in, integral, characterization unit allowing characterization of the device without the need for external test equipment.

27 Claims, 3 Drawing Sheets

INTEGRATED CIRCUIT (IC) WITH ON-BOARD CHARACTERIZATION UNIT

The present invention relates to the field of integrated circuit (IC) testing.

During fabrication, and particularly at the end of a production cycle, an IC is tested to ensure its quality and functionality. If, at any point during the production cycle, an IC is found not to function correctly, or has operating parameters which fall outside specified ranges, it may be discarded in order to save time and money.

Such tests must be cheap and efficient, and must use as little specialized test equipment as possible in order to minimize test costs.

In addition to tests to determine functionality, other tests are also performed in order to ascertain certain operating parameters of an IC such as maximum and minimum operating voltage and/or temperature, and maximum and minimum applicable clock frequencies, for example.

These tests enable the 'characterization' of the IC, and are also performed with expensive test equipment. The characterization enables the specification of the IC product to be readily available for a consumer, enabling them to determine a device's suitability for a particular application. Any characterization carried out must, therefore, be correct, and is an important part in the production cycle of integrated circuit devices.

Due to costs, not every IC is characterized, however. In the current process technologies this is still acceptable. In future technologies, however, the process spread will increase in such a way that dies on a single wafer will get different physical parameters, and therefore characterizing every IC will become mandatory in order to ensure a good quality product. In this case, characterization must be cheap enough so that it may be able to be applied to every IC.

FIG. 1 shows the results of a typical characterization process carried out using expensive test equipment. FIG. 1 is a so-called 'Shmoo plot', which shows a characterization of the frequency of an IC versus supply voltage of the IC in question.

Specifically, a Shmoo plot, as exemplified by FIG. 1, is a graph which represents how a particular test passes or fails when parameters like frequency, voltage, or temperature are varied and the test is executed repeatedly on the IC in question. The shape of the failing region is meaningful and helps in determining the cause of the failure. In the Shmoo plot of FIG. 1, a pass is shown as a white square, and a fail is shown as a grey square. A Shmoo plot of a normal circuit operation shows better high-frequency performance as supply voltage increases, as shown in FIG. 1.

In order to make characterization tests viable, they must be performed quickly, and utilize as little test equipment as possible. However, as mentioned, due to increasing process shifts (even on a single wafer) for new semiconductor IC technologies, a characterization test is unlikely to produce the same results (i.e. operating parameters) for every IC. However, in order to ensure low production costs, it is not practicable to separately characterize every IC at the end of its production process using the test equipment.

US 2001/0035766 (to Nakajima) discloses a method and a device for providing a characterization of a device (or product). The Nakajima document discloses that the method may be implemented into an IC test device. This embedded device is separate from the device to be tested, however, and therefore does not overcome the current characterization problems as the method and device of the Nakajima patent is directed towards the characterization of another device.

There is therefore a need for a method and system which is able to provide cost effective and space efficient characterization of ICs and which obviates the need for separate, expensive and/or extensive test equipment, and which provides reliable characterization data for each IC.

According to an aspect of the present invention there is provided a semiconductor device characterized by an integral characterization unit operable to provide characterization data for the device.

According to an aspect of the present invention there is provided a method of characterizing a semiconductor device comprising a functional device characterized by providing an integral characterization unit in the semiconductor device, and obtaining characterization data from the integral characterization unit.

FIG. 2 shows an IC 201 having an architecture according to an aspect of the present invention.

A supply voltage and clock signal of the IC 201 are controlled by a voltage controller 203, and a clock controller 205 respectively. According to an aspect of the present invention, the voltage controller 203 is operable to provide a variable voltage supply to a device under characterization (DUC) 207, whilst the clock controller 205 is operable to provide a variable clock signal to the DUC 207 (i.e. a clock signal with a variable period). The controllers 203, 205 may usefully be described as 'characterization parameter controllers' to describe their function as controllers which are operable to control a characterization parameter of the DUC 207.

Figure 2:
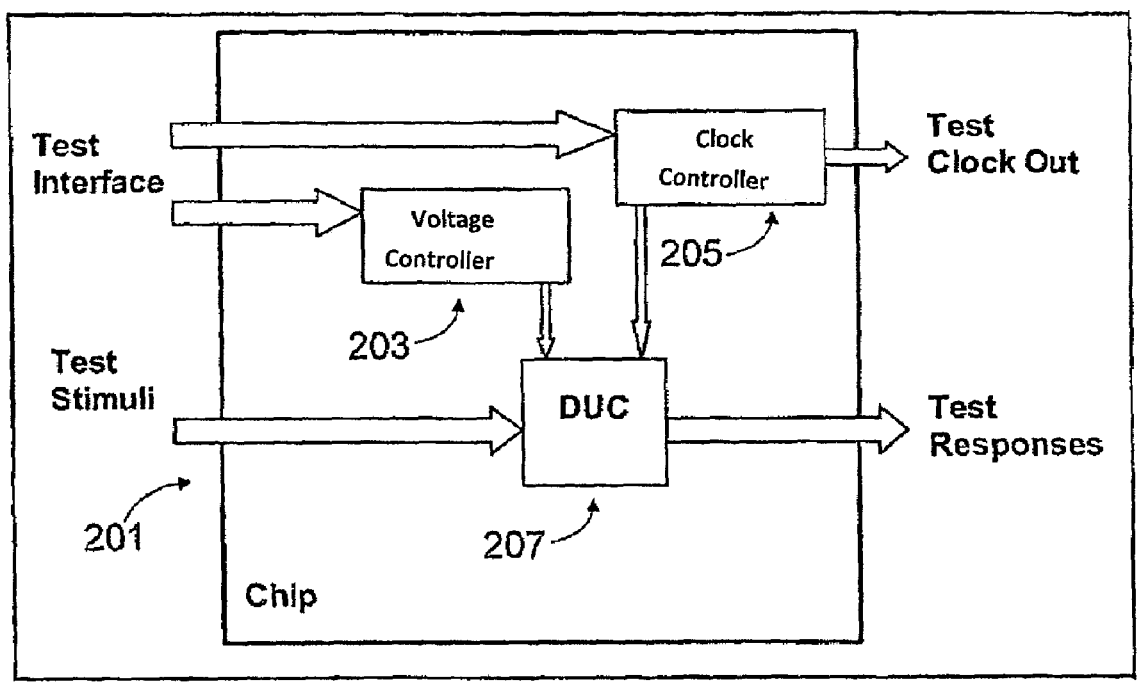
FIG. 2 shows an IC architecture according to an aspect of the present invention.

A test interface is provided in order to supply instructions to the controllers 203, 205. In the implementation of FIG. 2, a hardware or software controller is available outside of the IC 201 in order to execute a characterization. Test stimuli are applied to the DUC 207 externally through an interface. The clock controller 205 is also operable to output the clock signal from the IC 201 in order to synchronize the test stimuli and responses thereto to the external world.

Specifically, the implementation of the system of FIG. 2 requires a test interface which is operable to provide the voltage controller 203 and the clock controller 205 with the required parameters in order to start a characterization process. The DUC 207 is provided with the test stimuli from an external hardware or software source through a further interface.

The DUC 207 provides the functionality of the IC 201, and all other parts of the IC 201 such as the voltage controller 203 and the clock controller 205 are ancillary items providing test functionality on the IC 201 in accordance with the present invention.

The combination of supplying test stimuli and variable voltage and clock signals via the voltage and clock controllers 203, 205 respectively allows the DUC 207 to be characterized with respect to the parameters controlled by the controllers 203, 205. In the example shown in FIG. 2, the parameters used to perform the characterization are therefore voltage and clock period. It will appreciated, however, that any parameter suitable for forming a characterization of a DUC 207 may be controlled by the controllers 203, 205.

In this manner, IC characterization may be performed 'on-chip', thereby providing a built-in chip characterization (BICC) system.

Figure 3:
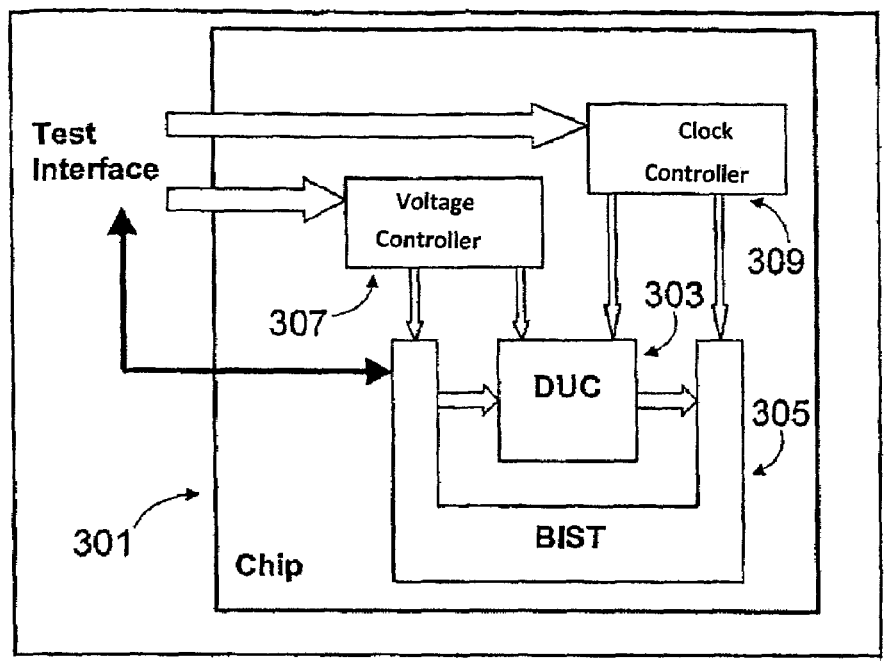
FIG. 3 shows an IC architecture according to another aspect of the present invention.

FIG. 3 shows an IC 301 having an architecture according to a second embodiment of the present invention. A device under characterization 303 (DUC) is surrounded by built-in self test (BIST) hardware 305 that is operable to generate test stimuli and observe the responses. The use of BIST is well known in the art. The present invention is not directly concerned with BIST, and this will not therefore be described in any further detail.

A supply voltage and clock signal of the IC 301 are controlled by a voltage controller 307, and a clock controller 309. As in the previous embodiment, voltage controller 307 is operable to provide a variable voltage supply to both the DUC 303, and the BIST hardware 305, whilst the clock controller 309 is operable to provide a variable clock signal to the DUC 303. The clock signal is also supplied to the BIST hardware 305. Both the controllers 307, 309 are controlled by the use of external software or hardware control means (not shown). The controllers 307, 309 receive data through a test interface of IC 301.

As before, the DUC 303 provides the functionality of the IC 301, and all other parts of the IC 301 such as the BIST hardware 305, the voltage controller 307 and clock controller 309, are ancillary items providing test functionality on the IC 301.

In the implementation of FIG. 3, an external hardware or software controller is used to execute a characterization process. Test stimuli are generated internally via the BIST module 309. The test results are output through the test interface.

Figure 1:
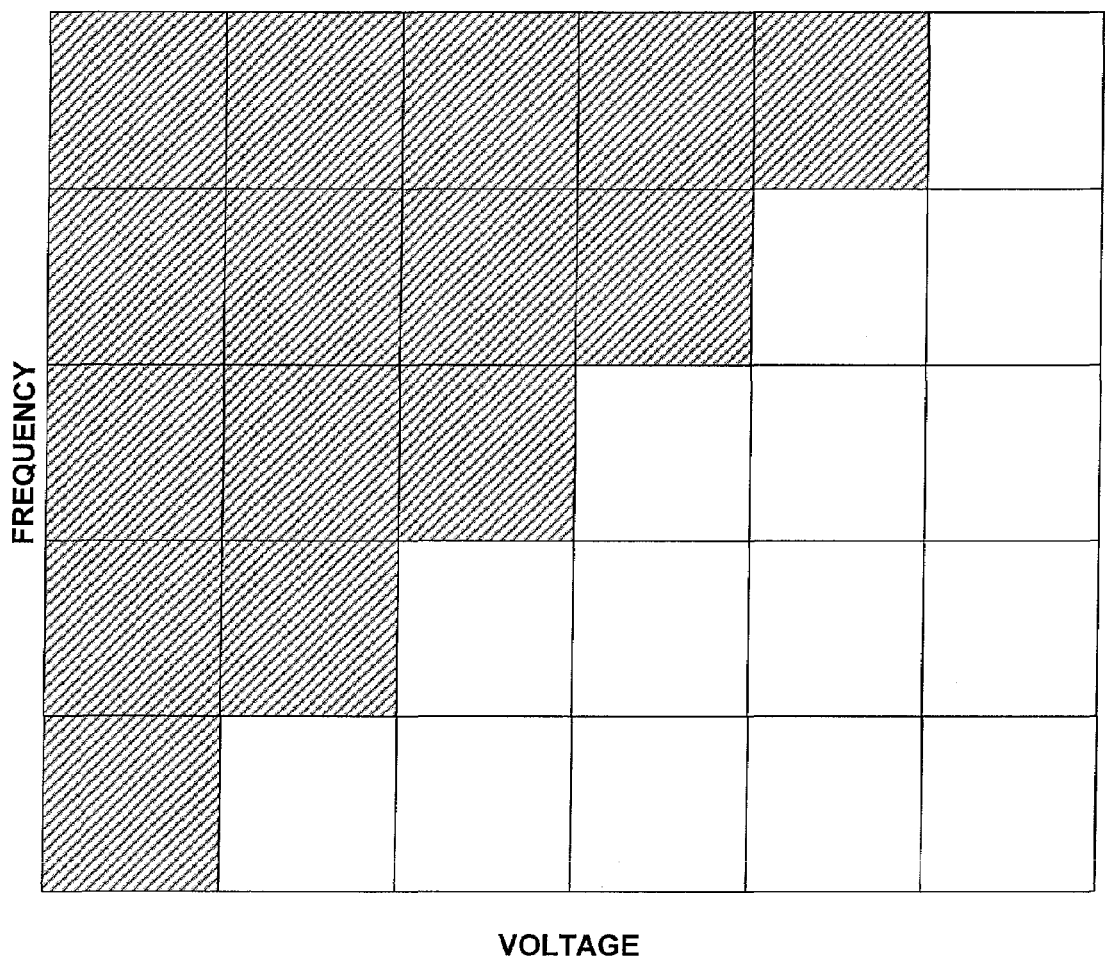
FIG. 1 is a Shmoo plot for a device under characterization.

In a similar manner to the system of FIG. 2, the controllers 307, 309 are operable to vary a characterization parameter of the DUC 303. For each value of the characterization parameter, a test is performed on the DUC 303. In this manner, characterization of the DUC 303 is performed, the results of which are output from the IC as explained above. The results may be used to generate a Shmoo plot similar to that shown in FIG. 1, so as to provide a characterization of the DUC 303 with respect to the parameters controlled by controllers 307, 309 (i.e. voltage and clock period respectively in the example of FIG. 3).

The implementations of FIGS. 2 and 3 provide BICC functionality, but requires the use of an external (to the IC 201, 301) software or hardware. In this way, IC area may be saved as an internal global control module is not required.

Figure 4:
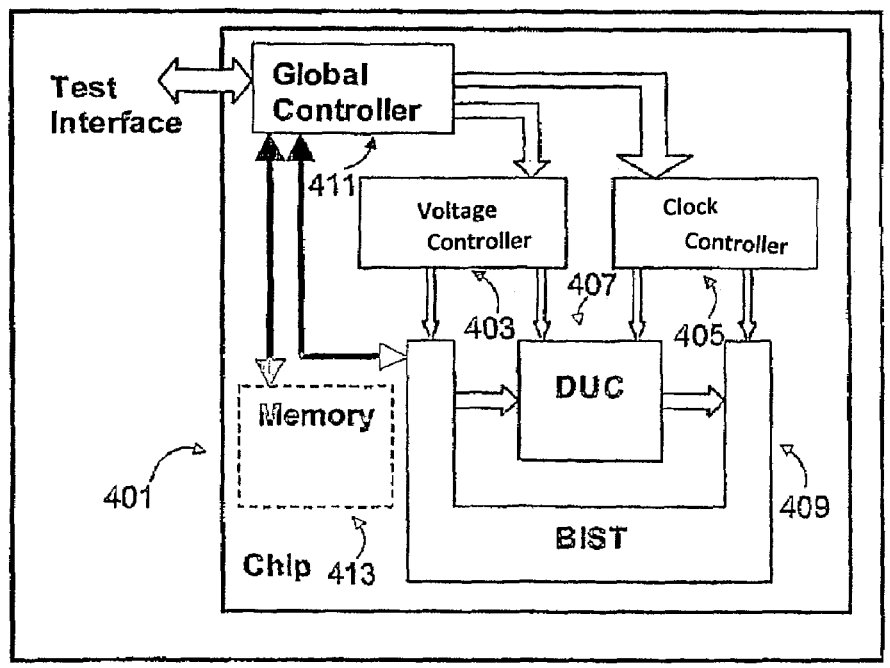
FIG. 4 shows an IC architecture according to another aspect of the present invention.

FIG. 4 shows an IC 401 according to another embodiment of the present invention. In FIG. 4, the BICC system comprises a voltage controller 403, a clock controller 405, a DUC 407, and BIST functionality provided by BIST hardware 409, similar to that shown in FIG. 3.

A test interface is provided in order to supply instructions to a global controller 411. In one method of operation, the global controller 411 receives a prompt through the test interface in order to start a characterization process. The prompt can include a request to the global controller 411 to begin the process, and can also include the parameters of the chip 401 that are to be characterized during the process.

Upon reception of this prompt data, the controller 411 is operable to vary certain parameters of the chip 401 via the use of the controllers 403, 405 (which in this case control a voltage and clock signal respectively).

Specifically, the global controller 411, after having received the necessary prompt and characterization parameters through the test interface, is operable to vary certain parameters of the DUC 407 via the use of the controllers 403, 405. In the example shown in FIG. 4, controllers 403, 405 control a voltage and clock signal of the DUC 407 respectively, and will therefore enable a characterization of the DUC 407 to be performed with respect to IC supply voltage and clock frequency. Such a characterization is usefully depicted in the form of a Shmoo plot as described above with reference to FIG. 1.

The global controller 411 is operable to program the controllers 403, 405 repeatedly so that a 'virtual' Shmoo plot may be generated.

The implementation of the present invention as exemplified by FIGS. 2 and 3 also advantageously enables the generation of a 'virtual' Shmoo plot, but instead of the global controller providing the characterization parameter controllers with data, this is provided through a test interface from software or hardware.

If BIST is used (FIGS. 3 and 4) in the characterization process, the Shmoo plot will only have pass/fail information. If, however, no BIST is used (FIG. 2), the Shmoo plot may also contain the number of faults per test. In general, however, the virtual Shmoo plots as generated by the characterization process of the present invention are the same as those generated using external test equipment. As is necessary for Shmoo plots generated by the test equipment, external software is required in order to be able to view and evaluate the Shmoo plots.

It will be appreciated by those skilled in the art, that although the present invention is being described with reference to voltage and clock controllers, any suitable parameter of the DUC 403 may be controlled by controllers 403, 405. The use of voltage and clock controllers is not intended to be limiting, and is merely included in order to better explain the inventive concept and particular advantages brought forth by the present invention.

If there are memory modules 413 available on the IC 401, it is possible to save the generated Shmoo plot in memory so that it may be read out at the end of the Shmoo plot generation. This will enable the characterization process to be sped up since clock/voltage data will not need to be output from the IC following every measurement cycle.

If, however, no memory modules are available, characterization information is output directly via the test interface.

It will be appreciated by those skilled in the art that the examples given above with reference to, and as shown in FIGS. 2 to 4 are presented in order to better explain the inventive concept embodied by the present invention, and are not intended to be limiting. In particular, it will be appreciated that alternative implementations of the present invention not explicitly mentioned herein are possible. Specifically, the exact nature of tasks performed on- and off-chip (which dictates the number of control and test modules present on the chip) may be varied in order to suit a particular application, or to save chip space, for example. The implementations explained above with reference to the figures merely, therefore, present three specific examples of IC architectures according to the inventive concept of the present invention.

The invention claimed is:

1. A semiconductor device comprising:
   a functional device that is responsive to test stimuli; and
   an integral characterization unit to control the functional device, in response to test interface inputs generated externally from the semiconductor device, to operate in response to the test stimuli for providing characterization data for the functional device, the integral characterization including
      a variable voltage controller that is responsive to the test interface inputs by providing a variable voltage to the functional device, and
      a variable clock signal controller that is responsive to the test interface inputs by providing a variable clock signal to the functional device.

2. A semiconductor device as claimed in claim 1, wherein the integral characterization unit provides a control signal to control an operating parameter of the functional device to generate pass/fail data in response to the test stimuli that are provided directly to the functional device, via circuit connectors, from an external test stimuli generator.

3. A semiconductor device as claimed in claim 2, wherein the integral characterization unit provides a control signal to control a voltage supply of the functional device.

4. A semiconductor device as claimed in claim 2, wherein the integral characterization unit provides a control signal to control a clock signal of the functional device.

5. A semiconductor device as claimed in claim 4, wherein the integral characterization unit provides the clock signal externally to said functional device.

6. A semiconductor device as claimed in claim 1, wherein the functional device receives the test stimuli directly from an external source.

7. A semiconductor device as claimed in claim 6, wherein the functional device is responsive to said test data by producing a test response.

8. A semiconductor device as claimed in claim 6, wherein the functional device receives a control signal from said integral characterization unit.

9. A semiconductor device as claimed in claim 6, further including built in test hardware to provide test data to the functional device in response to control inputs from the integral characterization unit.

10. A semiconductor device as claimed in claim 9, wherein the built in test hardware is IEEE 1149.1 compliant.

11. A semiconductor device as claimed in claim 9, comprising a test interface and wherein the built in test hardware receives test data through a test interface of the semiconductor device.

12. A semiconductor device as claimed in claim 9, wherein the built in test hardware is responsive to said test data supplied to said functional device by providing test response data.

13. A semiconductor device as claimed in claim 12, wherein the built in test hardware outputs said test response data from the functional device.

14. A semiconductor device as claimed in claim 1, comprising a test interface, and wherein the integral characterization unit receives data through the test interface.

15. A semiconductor device as claimed in claim 1, further including software control means to provide control data to the integral characterization unit.

16. A semiconductor device claimed in claim 15, wherein the control means provides control data to the integral characterization unit through a test interface of the semiconductor device.

17. A semiconductor device as claimed in claim 1, further including hardware control means to provide control data to the integral characterization unit.

18. A semiconductor device as claimed in claim 1, further including a memory module to store characterization data of the functional device.

19. A semiconductor device as claimed in claim 1, further including a controller to provide control data to the integral characterization unit.

20. A semiconductor device as claimed in claim 19, wherein the controller receives data over a test interface of the semiconductor device.

21. A semiconductor device as claimed in claim 1, further including,
a memory module that stores characterization data of the semiconductor device,
a controller that provides control data to the integral characterization unit, wherein the controller communicates with the memory module.

22. The device of claim 1, wherein the integral characterization unit consists of
a variable voltage controller that is responsive to the test interface inputs by providing a variable voltage to the functional device, and
a variable clock signal controller that is responsive to the test interface inputs by providing a variable clock signal to the functional device.

23. The device of claim 1, wherein the integral characterization unit controls the functional device, in response to test interface inputs generated externally from the semiconductor device, to provide characterization data including pass/fail data selected from the group of: minimum and maximum operating voltage, minimum and maximum operating temperature, and minimum and maximum operating clock frequencies.

24. A semiconductor device comprising
a functional device,
built-in test hardware providing functional test data to the functional device,
an integral characterization unit, including a variable voltage controller and a variable clock signal controller, for providing characterization test data to the functional device and for providing a variable voltage signal and a clock signal to the built-in test hardware, and
a controller that controls the integral characterization unit and the built-in test hardware.

25. A method of characterizing a semiconductor device including a functional device that is responsive to test stimuli, the method comprising
providing an integral characterization unit in the semiconductor device, and
using the integral characterization unit to control, in response to test interface inputs generated externally from the semiconductor device, the functional device to operate in response to the test stimuli by providing a variable voltage and a variable clock signal to the functional device to operate the functional device, and by outputting characterization data including pass/fail data for the functional device.

26. A method as claimed in claim 25, further comprising providing a control signal to control an operating parameter of the functional device.

27. The method of claim 25, wherein using the integral characterization unit to control the functional device consists of
providing a variable voltage to the functional device, and
providing a variable clock signal to the functional device.

* * * * *